United States Patent Office 3,203,805

Patented Aug. 31, 1965

3,203,805

WAX-COATED PHOTOPOLYMERIZABLE ELEMENTS AND PROCESSES FOR USING SAME

Marion Burg, Metuchen, N.J., assignor to E. I. du Pont de Nemours and Company, Wilmington, Del., a corporation of Delaware No Drawing. Filed Oct. 30, 1962, Ser. No. 234,214
22 Claims. (Cl. 96—115)

This application is a continuation-in-part of my prior U.S. application Ser. No. 156,538, filed Dec. 1, 1961, and entitled "Elements and Processes" (abandoned Sept. 29, 1963).

This invention relates to elements for image reproduction and more particularly to such elements wherein images are formed by photopolymerization techniques. This invention also relates to an image transfer process utilizating such elements.

Various elements useful for producing copies of an image by thermal transfer are known. Some of the elements, such as those disclosed in assignee's Burg and Cohen U.S. Patents 3,060,023, 3,060,024 and 3,060,025, of Oct. 23, 1962, are useful primarily in forming images by dry addition photopolymerization reactions. The elements, like many other addition-polymerizable systems, are inhibited by oxygen in the air. To overcome the effect of oxygen and to obtain satisfactory results, it has been necessary to expose the photopolymerizable elements to a relatively high intensity source of actinic radiation and/or expose the elements in a vacuum frame.

In assignee's Heiart application Ser. No. 81,377, filed Jan. 9, 1961 (U.S. Patent 3,060,026, Oct. 23, 1962), there is disclosed an improved photopolymerizable element having a removable cover sheet capable of uniformly transmitting actinic radiation and having a low permeability to oxygen (e.g., a film sheet of polyethylene terephthalate). Such a removable cover sheet if present at least during exposure increases the speed of the photopolymerization reaction by limiting oxygen inhibition. To be useful for image transfer, the element cover sheet has to be removed prior to transfer of the image. Not only is it undesirable to go to the expense of providing an expendable cover sheet, but it is burdensome timewise and laborwise to remove the cover sheet prior to thermal transfer.

An object of this invention is to provide a novel element which may be used in new and more practical processes for forming images by photopolymerization. Another object is to provide an element which may be used simply and dependably in simple and economical apparatuses. Still another object is to provide such an element which is not inhibited by oxygen in the air. A further object is to provide such an element which yields excellent thermally transferred images when exposed at normal atmospheric conditions with relatively low intensity actinic radiation and subsequently brought into contact at an elevated temperature with an image-receptive support. Yet a further object of this invention is to provide a new process for forming images by photopolymerization. Still further objects will be apparent from the following description of the invention.

The novel image-yielding elements of this invention comprise a support bearing a photopolymerizable stratum solid below 40° C., said stratum bearing a cover stratum having a thickness of 0.00001 to 0.004 inch comprising at least one wax, the cover stratum being characterized by having a melting point of at least 40° C., e.g., up to 150° C., having low permeability to oxygen and being capable of transmitting actinic radiation. Preferably the wax cover stratum is also essentially colorless and is present in a dry thickness of up to 0.004 inch.

A preferred embodiment of the photopolymerizable element comprises a support bearing a photopolymerizable stratum solid below 40° C., said stratum being thermally transferable by having a stick temperature above 40° C. and below 220° C., comprising (*a*) a viscosity-modifying agent, preferably a thermoplastic compound solid at 50° C., and (*b*) a non-gaseous ethylenically unsaturated compound containing at least one terminal ethylenic group, having a boiling point above 100° C. at normal atmospheric pressure, being capable of forming a high polymer by free-radical initiated, chain-propagating, addition polymerization, said components (*a*) and (*b*) being present in amounts from 3 to 97 and 97 to 3 parts by weight, respectively, said photopolymerizable stratum bearing at least one cover stratum containing at least 15% by weight of a wax as defined above, said cover stratum being thermally transferable at or above its melting point. Viscosity-modifying agents may either raise or lower the viscosity and stick temperature of the photopolymerizable composition and thus may include thermoplastic compounds (especially thermoplastic polymeric compounds), plasticizers and inert filler materials.

In a particularly preferred composition at least 0.001 part per hundred parts by weight of components (*a*) and (*b*) of (*c*) a free-radical generating polymerization initiator activatable by actinic radiation and (*d*) 0.001 to 4.0 parts per hundred parts by weight of components (*a*) and (*b*) of a thermal addition polymerization inhibitor are present.

Waxes useful for the cover stratum include animal, vegetable and mineral waxes illustrated in the examples, and in addition the various natural and synthetic waxes disclosed in Bennett's Commercial Waxes, Chemical Publishing Co., New York (1956) which meet the required criteria of the cover stratum set forth above. Preferred wax compositions include a mixture of synthetic ozokerite wax and a very high molecular weight synthetic normal paraffin wax;* and a modified ozokerite wax having predominately branched-chain molecules and melting at 65 to 68° C. with synthetic normal paraffin wax* of very high molecular weight.

In using the wax materials, it may be desirable to employ wetting agents to insure a uniform application of the thin cover stratum. Examples of useful wetting agents are various fatty acid esters of polyhydroxy compounds, such as glycerol monolaurate, as well as the various hexitol anhydride fatty acid esters, e.g., the monolaurate, monopalmitate, monostearate, tristearate, monooleate and trioleate; polyoxyalkylene derivatives of fatty acid partial esters of hexitol anhydride, e.g., the monolaurate, monopolmitate, monostearate, tristearate, monooleate and trioleate; long-chain aliphatic amines (primary, secondary or tertiary), e.g., stearylamine; amine salts of long-chain fatty acids, e.g., morpholinium oleate; alkyl aryl polyether alcohols, e.g., isooctyl phenyl polyethoxy ethanol; oil-soluble sodium sulfonates, e.g., sodium dioctyl sulfosuccinates; oil-soluble sodium salts of carboxylic acid, water-soluble polyethylene ethers of fatty alcohols, e.g., polyoxyethylene octadecyl ether, refined lecithins (the esters of oleic, stearic, palmitic or other fatty acids with glycerophosphoric acid and choline) and oil-soluble fatty acid alkanolamides, e.g., β-hydroxyethyl stearamide, and their polyoxyalkylene derivatives. Also useful as wetting agents are long-chain fatty acids, e.g., palmitic, stearic and oleic acids, alkyl sulfonic acids, e.g., n-hexadecane sulfonic acid, and long-chain alkyl sulfuric acids, e.g., n-hexadecylsulfuric acid.

In some instances a background stain may appear upon thermal transfer. The color of the stain varies according

*Made by Fischer-Tropsch process (see Example VIII).

to the dye or other ingredients used in the photopolymerizable composition. The stain, while having little effect on the quality of the transferred image, is nevertheless undesirable. It has been found that if the cover stratum has dispersed thereon a finely divided material which is infusible at the operating temperature, e.g., talc or the like, and (optionally) the surface is heated so that the material may penetrate into the fused wax surface, subsequently upon transfer the stain is virtually eliminated.

A wide range of photopolymerizable compositions can be used in the preparation of the elements. In general, the compositions are such that they do not soften at temperatures below 40° C. and do not undergo any essential change in softening temperature by holding for up to 15 seconds at the original softening temperature of the composition.

Suitable viscosity-modifying agents (*a*) include thermoplastic compounds, e.g., (A) Copolyesters, e.g., those prepared from the reaction product of a polymethylene glycol of the formula $HO(CH_2)_nOH$, wherein *n* is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids;

(B) Nylons or polyamides, e.g., N-methoxymethyl polyhexamethylene adipamide;

(C) Vinylidene chloride copolymers, e.g., vinylidene chloride/acrylonitrile; vinylidene chloride/methylacrylate and vinylidene chloride/vinylacetate copolymers;

(D) Ethylene/vinyl acetate copolymers;

(E) Cellulose ethers, e.g., methyl cellulose, ethyl cellulose and benzyl cellulose;

(F) Polyethylene;

(G) Synthetic rubbers, e.g., butadiene/acrylonitrile copolymers, and chloro-2-butadiene-1,3 polymers;

(H) Cellulose esters, e.g., cellulose acetate, cellulose acetate succinate and cellulose acetate butyrate;

(I) Polyvinyl esters, e.g., polyvinyl acetate/acrylate, polyvinyl acetate/methacrylate and polyvinyl acetate;

(J) Polyacrylate and alpha-alkyl polyacrylate esters, e.g., polymethyl methacrylate and polyethyl methacrylate;

(K) High molecular weight polyethylene oxides of polyglycols having average molecular weights from about 4,000 to 1,000,000;

(L) Polyvinyl chloride and copolymers, e.g., polyvinyl chloride/acetate;

(M) Polyvinyl acetal, e.g., polyvinyl butyral, polyvinyl formal;

(N) Polyformaldehydes;

(O) Polyurethanes;

(P) Polycarbonates;

(Q) Polystyrenes;

(R) Extralinear unsaturated polyamides, e.g., N-acrylyloxymethyl and N-methacrylyloxymethyl polyamides.

When the photopolymerizable stratum comprises ethylenically unsaturated polymeric compositions capable of further polymerization or crosslinking as are described below, plasticizing agents such as low molecular weight polyalkylene oxides, ethers and esters, e.g., triethylene glycol dicaprylate, polypropylene glycol mono-n-butyl ether; and other esters such as phthalates, e.g., dibutyl phthalate; adipates, e.g., diisobutyl adipate; sebacates, e.g., dimethyl sebacate, can be used. In addition, phosphates, e.g., tricresyl phosphate; amides and sulfonamides, e.g., N - ethyl - p - toluene - sulfonamide; carbonates, e.g., bis(dimethylbenzyl) carbonate; citrates, e.g., triethyl citrate; glycerol esters, e.g., glycerol triacetate; laurates, e.g., n-butyl laurate; oleates, stearates, etc.; and sucrose octaacetate are also useful.

To the thermoplastic polymer constituent of the photopolymerizable composition there can be added non-thermoplastic polymeric compounds to improve certain desirable characteristics, e.g., adhesion to the base support, adhesion to the image-receptive support on transfer, wear properties, chemical inertness, etc. Suitable non-thermoplastic polymeric compounds include polyvinyl alcohol, cellulose, anhydrous gelatin, phenolic resins and melamineformaldehyde resins, etc. If desired, the photopolymerizable layers can also contain immiscible polymeric or non-polymeric organic or inorganic fillers or reinforcing agents which are essentially transparent at the wave lengths used for the exposure of the photopolymeric material, e.g., the organophilic silicas, bentonites, silica, powdered glass, colloidal carbon as well as various types of dyes and pigments. Such materials are used in amounts varying with the desired properties of the photopolymerizable layer. The fillers are useful in improving the strength of the composition, reducing tack and, in addition, as coloring agents.

The ethylenically unsaturated compound (*b*) which is capable of polymerizing or forming a high polymer in a short period of time by photoinitiated, chain-propagating, addition polymerization can be any of the monomeric compounds disclosed in Plambeck U.S. Patent 2,760,863. Preferably the compounds are non-gaseous at 20° C. and atmospheric pressure, have 1 to 4 or more terminal ethylenic groups, preferably 2 or more, and a plasticizing action on the thermoplastic polymer in addition to its other properties disclosed above. Suitable compounds, which may be used alone or in combination, include preferably an alkylene or a polyalkylene glycol diacrylate prepared from an alkylene glycol of 2 to 15 carbons or a polyalkylene ether glycol of 1 to 10 ether linkages, and those disclosed in Martin and Barney U.S. Patent 2,927,022, issued March 1, 1960, e.g., those having a pluarilty of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures. The following specific compounds are further illustrative of this class: unsaturated esters of alcohols, preferably polyols and particularly such esters of the alphamethylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol triacrylate and trimethacrylate, pentaerythritol tetraacrylate and tetramethacrylate, 1,3-propanediol diacrylate, 1,5-pentanediol dimethacrylate, the bis-acrylates and methacrylates of polyethylene glycols of molecular weight 200–1500, and the like; unsaturated amides, particularly those of the alphamethylene carboxylic acids, and especially those of alpha, omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis-(gamma-methacrylamidopropoxy) ethane beta-methacrylamidoethyl methacrylate, N-(beta-hydroxyethyl)-beta-(methacrylamido)ethyl acrylate and N,N-bis(beta-methacrylyl-oxyethyl)acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamines wherein the molecular chain between the hydroxyls and amino groups is solely carbon or oxygen-interrupted carbon. The preferred monomeric compounds are di- or poly-functional, but mono-functional monomers can also be used. The amount of monomer added varies with the particular thermoplastic polymer used.

The ethylenic unsaturation can be present as an extra-linear substituent attached to a thermoplastic linear polymer, such as polyvinyl acetate/acrylate, cellulose acetate/acrylate, cellulose acetate/methacrylate, N-acrylyloxymethylpolyamide, N-methacrylyloxymethylpolyamide, allyloxymethylpolyamide, etc., in which case the monomer and polymer functions are combined in a single material.

A preferred class of free-radical generating addition polymerization initiators (*c*) activatable by actinic light and thermally inactive at and below 185° C. includes the substituted or unsubstituted polynuclear quinones which are compounds having two intracyclic carbonyl groups attached to intracyclic carbon atoms in a conjugated carbocyclic ring system. Suitable such initiators include 9,10 - anthraquinone, 1 - chloroanthraquinone, 2 - chloroanthraquinone, 2 - methylanthraquinone, 2 - ethyl-anthraquinone, 2 - tert - butylanthraquinone, octamethylanthraquinone, 1,4-naphthoquinone, 9,10-phenanthrenequinone, 1,2-benzanthraquinone, 2,3-benzanthraquinone, 2-methyl-1,4 - naphthoquinone, 2,3 - dichloronaphthoquinone, 1,4-dimethylanthraquinone, 2,3 - dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4 - tetrahydrobenz[a]anthracene - 7,12 - dione. Certain aromatic ketones, e.g., benzophenone, are also useful as are the following photoinitiators, some of which may be thermally active at temperatures as low as 85° C., e.g., those described in Plambeck U.S. Patent 2,760,863 and include vicinal ketaldonyl compounds, such as diacetyl, benzil, etc.; alphaketaldonyl alcohols, such as benzoin, pivaloin, etc.; acyloin ethers, e.g., benzoin methyl and ethyl ethers, etc.; alpha-hydrocarbon substituted aromatic acyloins, including alpha-methylbenzoin, alpha-allylbenzoin, and alpha-phenylbenzoin. Silver persulfate is also useful as a free-radical generating initiator activatable by actinic radiation.

Suitable thermal polymerization inhibitors (*d*) useful in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene, in addition to p-toluquinone and chloranil.

Various dyes, pigments, thermographic compounds and color-forming components can be added to the photopolymerizable compositions to give varied results after the thermal transfer. These additive materials, however, preferably should not absorb excessive amounts of radiation at the exposure wave length or inhibit the polymerization reaction.

Among the useful dyes are Fuchsine (CI 42510), Auramine Base (CI 41000B), Calcocid Green S (CI 44090), Para Magenta (CI 42500), Tryparosan (CI 42505), New Magenta (CI 42520), Acid Violet RRL (CI 42425), Red Violet 5RS (CI 42690), Nile Blue 2B (CI 51185), New Methylene Blue GG (CI 51195), CI Basic Blue 20 (CI 42585), Iodine Green (CI 42556), Night Green B (CI 42115), CI Direct Yellow 9 (CI 19540), CI Acid Yellow 17 (CI 18965), CI Acid Yellow 29 (CI 18900), Tartrazine (CI 19140), Supramine Yellow G (CI 19300), Buffalo Black 10B (CI 27790) Naphthalene Black 12R (CI 20350), Fast Black L (CI 51215), and Ethyl Violet (CI 42600).

Suitable pigments include, e.g., $TiO_2$, colloidal carbon, graphite, phosphor particles, ceramics, clays, metal powders such as aluminum, copper, magnetic iron and bronze, etc. The pigments are useful when placed in the photosensitive layer or in an adjacent non-photosensitive layer.

Useful thermographic additives, e.g., 3-cyano-4,5-dimethyl - 5 - hydroxy - 3 - pyrrolin-2-one are disclosed in Howard, U.S. Patent No. 2,950,987. Such compounds, in the presence of activators, e.g., copper acetate, are disclosed in assignee's Belgian Patent No. 588,328. Other useful thermographic additives are disclosed in the following U.S. patents: 2,625,494; 2,637,657; 2,663,654; 2663,655; 2,663,656 and 2,663,657.

Suitable color-forming components which form colored compounds on the application of heat or when brought in contact with other color-forming components on a separate support include, (1) *Organic and inorganic components.*—Dimethyl glyoxime and nickel salts; phenolphthalein and sodium hydroxide; starch/potassium iodide and oxidizing agent, i.e., peroxides; phenols and iron salts; thioacetamide and lead acetate; silver salt and reducing agent, e.g., hydroquinone.

(2) *Inorganic components.*—Ferric salts and potassium thiocyanate; ferrous salts and potassium ferricyanide; copper, mercury or silver salts and sulfide ions; lead acetate and sodium sulfide.

(3) *Organic components.*—2,4-dinitrophenylhydrazine and aldehydes or ketones; diazonium salt and phenol or naphthol, e.g., benzene diazonium chloride and beta-naphthol; substituted aromatic aldehydes or amines and a color photographic developer compound, e.g., p-dimethylaminobenzaldehyde and p-diethylaminoaniline; color photographic developer compound/active methylene compound and an oxidizing agent, e.g., p-diethylaminotoluidine/$\alpha$-cyanoacetophenone and potassium persulfate.

The photopolymerizable composition is preferably coated on a base support. Suitable support materials are stable at the operating temperatures used in the instant invention. Suitable bases or supports include those disclosed in U.S. Patent 2,760,863, glass, wood, paper (including waxed or transparentized paper), cloth, cellulose esters, e.g., cellulose acetate, cellulose propionate, cellulose butyrate, etc., and other plastic compositions such as polyamides, polyesters, e.g., polyethylene terephthalate; polyolefins, e.g., polyethylene and polypropylene. The support may have in or on its surface and beneath the photopolymerizable stratum an antihalation layer as disclosed in said patent or other substrata needed to facilitate anchorage to the base, and/or may have an anti-blocking or release coating on the back surface, e.g., finely divided inert particles in a polymeric binder, for instance, silica in gelatin.

The above-described element may be used in an image-reproducing process including the steps of exposing said element imagewise to actinic radiation at atmospheric conditions until polymerization, with an accompanying increase in stick temperature, of the photopolymerizable stratum takes place in the exposed image areas with substantially less polymerization and less increase in stick temperature in the underexposed, complementary, adjoining coplanar image areas to provide a difference of at least 10° C. in the stick temperature of said exposed and underexposed areas and subsequently transferring said image corresponding to the underexposed image areas and the overlying cover stratum by bringing the surface of the exposed element into operative contact with the surface of an image-receptive support at an operating temperature intermediate between the stick temperatures of said exposed and underexposed areas and at least equal to the melting point of said wax and subsequently separating the two surfaces at a temperature intermediate between the stick temperatures of the exposed and underexposed image areas.

The term "underexposed" as used herein is intended to cover the image areas which are completely unexposed or those exposed only to the extent that there is addition polymerizable compound still present in sufficient quantity that the softening temperature remains substantially lower than that of the complementary exposed image areas. The term "stick temperature," as applied to either an underexposed or exposed area of a photopolymerizable stratum, means the minimum temperature at which the image area in question sticks or adheres (transfers), within 5 seconds, under slight pressure, e.g., thumb pressure, to analytical paper (Schleicher & Schull analytical filter paper No. 595) and remains adhered in a layer of at least detectable thickness after separation of the analytical paper from the stratum.

Prior to the transfer step, the layer, protected by the thermally transferable cover stratum, is exposed to actinic radiation. This may be through a two-tone image or a process transparency, e.g., a process negative or positive (an image-bearing transparency consisting solely of substantially opaque and substantially transparent areas where the opaque areas are substantially of the same optical density, the so-called line or halftone negative or positive) or a stencil. The exposure may also be through a continuous tone, negative or positive image. The image or transparency may or may not be in operative contact with the protective cover sheet, e.g., contact exposure or projection exposure. It is possible to expose through paper or other light transmitting materials. A stronger radiation source or longer exposure times must be used, however.

Reflex exposure techniques are especially useful in the present invention, particularly when office copies are made. By using reflex exposure, copies can be made from materials having messages on both sides of a page or from opaque supports, e.g., paper, cardboard, metal, etc., as well as from poor light transmitting surfaces with no loss in speed, excellent resolution, and in addition, right reading copies are obtained directly on transfer.

Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs, particularly the sunlamps, are most suitable. The sunlamp mercury-vapor arcs are customarily used at a distance of one and one-half to twenty inches from the photopolymerizable layer. It is noted, however, that in certain circumstances it may be advantageous to expose with visible light, using a photoinhibitor sensitive in the visible region of the spectrum, e.g., 9,10-phenanthrenequinone. In such cases, the radiation source should furnish an effective amount of visible radiation. Many of the radiation sources listed above furnished the required amount of visible light.

After the exposure of the photopolymerizable layer, the exposed composition is brought into intimate contact with an image-receptive support while heat may be simultaneously applied to effect the transfer of the underexposed areas of the photopolymerizable composition. While the heat is preferably applied simultaneously with the contact of the exposed element to the receptive support, the heat can be applied at any stage of the process prior to the separation step to either or both elements provided: (1) that at no time during contact of the two elements does the operating temperature of the light-sensitive element exceed the stick temperature of the exposed areas, (2) that at the time of separation of the two elements, the temperature of the light-sensitive element is intermediate between the stick tempreatures of the underexposed and exposed areas of the photopolymerizable stratum, and (3) that at some time during contact of the two elements, the temperature of the wax and of the receptor surface exceeds the melting temperature of the wax. Heat can be applied by means well known to the art, e.g., rollers, flat or curved heating surfaces or platens, radiant sources, e.g., heating lamps, etc.

The duration of contact of the photopolymerizable element and the image-receptive surface can range from 0.01 to 10 seconds. In general about 0.1 second is adequate and shorter periods of contact are possible by using an intense radiant source of heat, e.g., infrared lamps or heat sources.

The image-receptive support to which the image is transferred must be stable at the operating temperatures. The particular support used is dependent on the desired use for the transferred image and on the adhesion of the image to the base. Suitable supports include paper including bond paper, resin and clay sized paper, resin coated or impregnated paper, cardboard, aluminum, copper, steel, bronze, etc.; wood, glass, nylon, rubber, polyethylene, linear condensation polymers such as the polyesters, e.g., polyethylene terephthalate, regenerated cellulose, cellulose esters, cellulose acetate, silk, cotton, viscose rayon and metal fabrics or screens. The image-receptive support may have a hydrophilic surface or may contain on its surface chemical compounds which react with compounds being transferred so as to produce differences in color, hydrophilicity or conductivity between the exposed and underexposed areas or for improved adhesion to or brightening of the receptive support. The image-receptive surface may be smooth, contain roughening agents such as silica, be perforated or be in the form of a mesh or screen.

In practicing a preferred embodiment of the invention, a photopolymerizable element containing the image-yielding stratum is coated with at least one thin cover stratum of a wax or mixture of waxes of high melting points of about 0.0001 inch in thickness capable of uniformly transmitting actinic radiation and having a low permeability to oxygen by techniques familiar to those skilled in the art, e.g, by skim coating with air doctoring. The coated element is exposed to actinic radiation reflectographically to a reflective surface bearing a light-absorbing message (or to a light-absorbing surface bearing a light-reflecting message) or through a photographic process transparency, e.g., a photographic positive, negative, halftone, or a light-transmitting paper. The exposed image-yielding element is then brought into intimate contact under pressure at the operating temperature, e.g., a temperature in the range of 40° to 220° C. or more, with the surface of an image-receptive support, e.g., paper, metal, synthetic polymer, screen, etc., and, while still warm, the surfaces are separated. The thermoplastic photopolymerizable composition is transferred in the areas corresponding to the underexposed thermally transferable areas to the receptive support e.g., paper, along with the transferable cover stratum, to give at least one copy of the original image. The wax material forming the transferable cover stratum is absorbed by the receptive support and/or is embedded in the transferred photopolymerizable material so it is barely detectable in the copy formed. Multiple copies can be obtained by repeating the heat transfer procedure using appropriate coating thicknesses of the photosensitive layer, pressures and temperatures to give the desired number of copies.

The photopolymerizable element, as will be noted in the examples to follow, comprises a support which has low permeability to atmospheric oxygen. Therefore it is only the surface of the photopolymerizable stratum opposite the support which requires protection from the influx of oxygen.

The invention will be further illustrated by, but is not intended to be limited to, the following detailed examples wherein the abbreviation CI refers to the Colour Index, 2nd Edition, 1956, The Society of Dyers and Colourists, Dean House, Picadilly, Bradford, Yorkshire, England, and the American Association of Textile Chemists and Colorists, Lowell Technological Institute, Lowell, Massachusetts, U.S.A.

*Example I*

The following solution was prepared:

| | Grams |
|---|---|
| Polyethylene glycol diacrylate | 1.000 |
| "Calcocid" Green S Dye (CI 44090) | 0.010 |
| Phenanthrenequinone (photoinitiator) | 0.008 |
| Cellulose acetate butyrate | 1.000 |
| Acetone to bring solution weight to 20.0 g. | |

The cellulose acetate butyrate contained ca. 13% acetyl groups, ca. 37% butyryl groups and had a viscosity of 64 to 124 poises as determined by ASTM method D–871–54T in the solution described as Formula A, ASTM method D–871–54T. The polyethylene glycol diacrylate was derived from polyethylene glycol with an average molecular weight of 300. The solution was coated to a depth of 0.0025 inch on a 0.0015 inch thick polyethylene terephthalate film support. The coating was dried and there resulted a 0.0005 inch thick photopolymerizable layer which was tacky to the touch but which could not be transferred at room temperature.

Onto the photopolymer stratum was then coated a stratum of wax of about 0.0002 inch dry thickness. The wax was a mixture of equal parts paraffin (fully refined paraffin wax, M.P. 89–90° C.) and a white synthetic ozokerite wax (blends of saturated hydrocarbons, simulating the natural bituminous wax occuring in miocene formations and characterized by having long fibers, unlike the structure of the paraffins and microcrystalline waxes, M.P. 116–119° C.). The wax was skim-coated from the melt at 98° C. and doctored to the desired thickness by means of a heated air knife.

Portions of the coating were then exposed through a transparency bearing a line image to a GE Type RS–275 watt sunlamp for 3 sec. at a distance of 3 inches. Transfers to paper were made by laying a sheet of bond paper on the coating and passing the superposed elements through pressure rollers at 130° C. and 2½ pounds of force per lineal inch of the rollers. The paper was separated from the film as it emerged from the rollers. Clear, sharp, positive images were produced with only barely detectable evidence of the wax being present. The copy could be written upon with ordinary inks without noticeable loss of wetting.

Without the wax overcoating, but using the same conditions for exposure and thermal transfer described above, there occurred total rather than image-wise transfer to the bond paper receptive surface. No copy of the image was obtained.

*Example II*

Example I was repeated with various waxes and wax blends as follows:

100% fully refined paraffins, melting points from 84–109° C.
100% synthetic ozokerite waxes, M.P.'s from 98–119° C.
50% microcrystalline wax, M.P. 107° C.; 50% paraffin wax, M.P. 90° C.
100% white beeswax, M.P. 97–101° C.
30% refined carnauba wax, M.P. 118–122° C.; 70% refined paraffin wax, M.P. 90° C.
3% poly(ethylene/vinyl acetate : : 7/3); 97% synthetic ozokerite wax, M.P. 109° C.
4% poly(ethylene/vinyl acetate : : 7/3); 48% synthetic ozokerite wax, M.P. 109° C.; 48% refined paraffin wax, M.P. 90° C.
4% poly(ethylene/vinyl acetate : : 7/3); 2% sorbitan monooleate having a viscosity at 25° C. of approximately 1000 centipoises and a flash point of 246° C.; 47% synthetic ozokerite wax, M.P. 109° C.; 47% refined paraffin wax, M.P. 93° C.

Results were obtained similar to those in Example I with all of the above thermally transferable, wax covering strata serving satisfactorily to eliminate or essentially reduce the effects of oxygen inhibition on photopolymerization.

*Example III*

The following solution was prepared:

| | Grams |
|---|---|
| Cellulose acetate butyrate | 35.0 |
| Phenanthrenequinone | 0.70 |
| "Calcocid" Green Dye (CI 44090) | 0.45 |
| Polyethylene glycol diacrylate | 35.0 |
| p-Methoxyphenol | 0.035 |
| Acetone to make 350 g. of solution. | |

The cellulose acetate butyrate contained ca. 20.5% acetyl groups, ca. 26% butyryl groups and had a viscosity of 56 to 131 poises determined by ASTM method D–1343–54T in solution described as Formula A, ASTM method D–871–54T. The polyethylene glycol diacrylate was derived from polyethylene glycol with an average molecular weight of 300. This solution was coated onto a 1-mil thick polyethylene terephthalate film and dried for 20 minutes to give a coating having a thickness of 0.0013 inch. The photopolymerizable layer was then coated with a solution of 2% by weight of fully refined paraffin wax (M.P. 93° C.) in hexane and dried. A wax layer ca. 0.0001 inch thick was formed on the surface. The wax overcoated element was exposed through a transparency bearing a line image to a 400 watt mercury-arc lamp, General Electric Co. Type H 400–RI for 10 seconds at 10 inches from the lamp. Image transfer was carried out as described in Example I and a good positive image was obtained. A similar element, but without the wax overcoating gave poor image transfer, having an extremely high background stain.

*Example IV*

A solution was prepared containing the following materials:

| | Grams |
|---|---|
| Pentaerythritol triacrylate | 45 |
| Triethylene glycol diacrylate | 15 |
| Cellulose acetate butyrate as described in Example I | 25 |
| Cellulose acetate having 39.4% acetyl groups and having an ASTM viscosity of 45 | 15 |
| Phenanthrenequinone | 0.60 |
| "Calcocid" Green S Ex. Conc. (CI 44090) | 1.00 |
| Acetone to make 600 g. of solution. | |

This solution was coated onto a 0.001-inch polyethylene terephthalate film and was dried. The dry coating thickness was 0.00035 inch. The coating was next overcoated with a blend consisting of 49 parts of a fully refined paraffin wax (M.P. 60° C.), 49 parts of a synthetic ozokerite wax as described in Example I but having a melting point in the range of 101° C., and 2 parts of a sorbitan monooleate surfactant (viscosity of 1000 centipoises at 25° C., flash point 246° C.), following the procedure of Example I.

Reflex exposure to a black and white original was made with a 20-watt blue fluorescent lamp, in contact, for 1.5 seconds. Transfer to a bond paper receptor sheet was made at 100° C. as described in Example I. A clear, sharp, positive image was obtained, although a slight trace of a blue stain appeared in the background.

A new portion of the waxed coating was sprinkled with finely powdered talc and the excess shaken off. The dusted material was heated momentarily to fuse the talc into the wax surface. This material was exposed and image transfer carried out as described above in this example. A sharp image was again obtained but with virtually no stain.

*Example V*

A solution was prepared with the following recipe:

| | Grams |
|---|---|
| Pentaaerythritol tetraacrylate | 45.0 |
| Triethylene glycol diacrylate | 15.0 |
| Cellulose acetate butyrate as described in Example I | 25.0 |
| Cellulose acetate described in Example IV | 15.0 |
| Phenanthrenenequinone | 0.600 |
| p-Methoxyphenol | 0.060 |
| Dye solution described below | 125.0 |
| Acetone to make 500 g. | |

The dye solution used above was prepared by adding to 150 ml. ethanol, 0.50 g. of a dye prepared by the reaction of an equimolar amount of Thioflavine TCN (CI Basic Yellow 1) and m-benzene disulfonic acid; 0.50 g. of Sevron Orange G (CI Basic Orange 21); and 0.75 g. of the reaction product from the following mixture:

1 mole Victoria Pure Blue BO (CI Basic Blue 7)
0.7 mole Crystal Violet (CI Basic Violet 3)
1 mole Rhodamine 5 G (Basic Dye CI No. 45105) with 1 mole of Solvent Blue 38 ("Luxol" Fast Blue MSBN)

The above dye solution was prepared by bringing it to a boil, centrifuging for 3 minutes and discarding the sediment.

This solution was coated onto 0.001-inch polyethylene terephthalate film and dried to give a coating which was 0.00031-inch thick. The coating was next overcoated with a stratum 0.0015-inch thick consisting of 59 parts of synthetic ozokerite wax (M.P. 63–64.5° C., described in Example I), 40 parts of a very high molecular weight synthetic normal paraffin wax (M.P. 98.9° C., made by the Fischer-Tropsch process, described in R. E. Kirk and D. F. Othmer, "Encyclopedia of Chemical Technology," volume 6, The Interscience Encyclopedia, Inc., New York, 1951, pp. 960-983, especially pp. 964, 978–980), and 1 part of a sorbitan monooleate surfactant described in Example IV.

Reflex exposure to a black and white original was made with a 20-watt blue flourescent lamp in contact for 1.6 seconds. Transfer to a bond receptor sheet was made at 117° C. as in Example I. A clear, sharp, positive image was obtained.

*Example VI*

Example V was repeated except that the ozokerite wax in the overcoating was replaced with an equal weight of a modified ozokerite wax having predominately branched-chain molecules and a melting point of 65–68° C., results similar to those of Example V being obtained upon image transfer. The wax overcoated element showed no evidence of tackiness at room temperature.

*Example VII*

A wax emulsion was prepared by vigorously stirring the following materials:

| | Grams |
|---|---|
| Hydrogenated castor oil | 10.70 |
| Stearic acid | 2.14 |
| Triethanolamine | 1.07 |
| $CH_3—C(CH_3)_2—CH_2—C(CH_3)_2—Ph—(O—CH_2CH_2)_n—OH$ (where $n$ is 9–10 and Ph is p-phenylene) | 0.53 |
| Water to make 100 g. | |

Twenty grams of this emulsion were mixed with 5 g. of saponin and 75 g. of water and the mixture was coated as a thin layer over a photopolymerizable coating similar to that described in Example V. The overcoated element was exposed and transferred as in Example V to give a clear, sharp, positive image, thus demonstrating the effectiveness of the wax barrier layer. The hydrogenated castor oil is a hard synthetic wax like compound obtained by the controlled hydrogenation of pure castor oil and having a penetration value of 0.2 mm. using a Penetrometer Needle No. 14 loaded with a 100 g. weight. Under similar testing conditions, carnauba wax has a penetration value of 0.1 mm. while beeswax has a penetration value of 1.7 mm.

*Example VIII*

A wax blend was prepared by melting 200 g. of a Fischer-Tropsch wax and adding, slowly with stirring, 800 g. of stearic acid while maintaining the temperature at 105 to 115° C. This wax blend was applied as a thin oxygen barrier layer over the photopolymerizable coating of Example VII by skim coating from the melt at about 110° C. and doctored to the desired thickness by means of a heated air knife. With exposure and transfer as described in Example V, there was obtained a clear, sharp positive image, thus demonstrating the effectiveness of the oxygen barrier layer. The wax is a synthetic paraffin wax having a melting point in the range of 93–97° C., made by the Fischer-Tropsch process, described in R. E. Kirk and D. F. Othmer, "Encyclopedia of Chemical Technology," volume 6, The Interscience Encyclopedia, Inc., New York, 1951, pages 960–983, especially pages 964 and 978–980.

*Example IX*

Six hundred grams of a fully refined paraffin wax having a melting point from 65–68° C., with a maximum oil content of 0.5% and a thermal gradient blocking point of 53° C., was melted at 115° C. To the melted wax there were added 400 g. of the Fischer-Tropsch wax described in Example VIII and 150 g. of polyethylene pellets and the mixture was stirred at 115° C. until a smooth blend of the melted materials was obtained. Again the wax blend was applied as a thin oxygen barrier layer over the photopolymerizable coating of Example VIII by skim coating from the melt at about 110° C. and doctored to the desired thickness by means of a heated air knife. With exposure and transfer as described in Example V, there was obtained a clear, sharp, positive image, thus demonstrating the effectiveness of the oxygen barrier layer. The polyethylene pellets were made from polyethylene of molecular weight 2000, melting point 106–110° C. (ASTM E 28–51T), hardness of 2 to 3 (Hardness Needle Penetration ASTM D 1321–55T) and average viscosity of 220 cps. at 140° C.

Satisfactory results were obtained with considerable variation in concentration of ingredients in the wax blend. Thus the two waxes were used in ratios of from 80 parts (i.e., parts by weight) of the refined paraffin and 20 parts of the Fischer-Tropsch wax to 50/50 ratios. Ratios in the range of 70/30 to 60/40 gave the best results. Similarly, the polyethylene concentration was varied from 1 part up to 30 parts per 100 parts of the two waxes. Best results were obtained in the range of 3 to 20 parts of polyethylene per 100 parts of the two waxes.

*Example X*

The oxygen-barrier overcoating composition of Example VII was replaced with a melted blend of 60 parts, by weight, of the fully refined paraffin wax with melting point 65–68° C. (described in Example IX), 40 parts, by weight, of the Fischer-Tropsch wax (described in Example VIII) and 1 part, by weight, of sorbitan monopalmitate. The overcoated element was exposed and transferred as in Example V to give a clear, sharp, positive image, thus demonstrating the effectiveness of the oxygen barrier layer.

*Example XI*

A web 10 feet long by 6 inches wide of the overcoated element described in Example X was sprayed with the melted hydrogenated castor oil described in Example VII until the element was evenly covered with the wax in a particulate form so as to give the visual appearance of a very fine grade of sand paper. The wax was applied from a conventional spray gun, using steam as the flow gas. The web was wound tightly on a one-inch diameter roll and could be unwound readily for inspection, showing no evidence of blocking or transfer of wax from the surface of the element to the back side of the element support. In contrast, a similar web which did not receive the spray treatment with the hydrogenated castor oil did exhibit wax transfer to the back side of the element support when it was wound tightly on a one-inch roll. Thus the spray application of the synthetic wax overcame the problems of wax transfer and blocking.

The Fischer-Tropsch wax described in Example VIII was used in the spray treatment in place of the hydrogenated castor oil. Wax transfer and blocking were again overcome, as well as oxygen inhibition.

*Example XII*

Preparation was repeated of the emulsion described in Example VII which contained 10.7 g. of hydrogenated castor oil and 2.14 g. of stearic acid per 100 g. total weight of emulsion. This emulsion was sprayed (by the process described in Example XI) onto a web of the overcoated element described in Example X. The resulting fine, particulate surface overlying the oxygen barrier layer satisfactorily overcame wax transfer and blocking when the web was wound on a roll. A similar result was obtained when the hydrogenated castor oil-stearic acid emulsion was applied as a thin skim coating rather than by spraying. The skim coating dried to give a particulate surface similar in appearance and effect to that produced by the spray process.

*Example XIII*

A photopolymerizable coating was prepared similarly to that described in Example V except that the coating composition contained 2% by weight of solid ingredients of the synthetic wax described in Example VII. The above photopolymerizable coating was overcoated with an oxygen barrier composition comprising a melted blend of 60 parts by weight of the fully refined paraffin wax of melting point 65–68° C. (described in Example IX), 40 parts of the Fischer-Tropsch wax (described in Example VIII) and 1 part of the synthetic wax (described in Example VII). The overcoating was able to be applied with very excellent uniformity and the element was free of cracking when tested under extremes of humidity and gave results similar to those of Example VII.

*Example XIV*

The photopolymerizable coating of Example XIII was overcoated with an oxygen barrier composition comprising a melted blend of 99 parts by weight of a high melting (88–91° C.), narrowly fractionated, microcrystalline wax (having a hardness of 3–5 by the Hardness Needle Penetration Test, ASTM D1321, conducted at 25° C.) and 1 part by weight of the hydrogenated castor oil described in Example VII. Besides being very satisfactory as an oxygen barrier, the element was free of cracking when tested at extremes of humidity. Furthermore, this element, with only one overcoat stratum, was free of the problems of wax transfer and blocking.

The novel elements of invention are useful for a variety of copying, printing, decorative and manufacturing applications. Pigments, e.g., $TiO_2$, colloidal carbon, metal powders, phosphors, etc., and dyes which do not appreciably absorb actinic radiation at the wave length being used for exposure or inhibit polymerization can be incorporated in the light-sensitive photopolymerizable layer, and by use of the above-described process, images can be transferred to a receptor support. Multicopies of the process images can be obtained from the transferred image. The number of copies prepared is dependent on the photopolymerizable composition thickness as well as the process conditions. The element is also useful for making multicolor reproductions. Colorless constituents which form colored compounds when heat is applied or brought into contact with other color forming components are useful in conjunction with the element.

Lithographic surfaces can be produced by thermally transferring a hydrophobic layer of the element to a hydrophilic receptor surface or vice versa. The images on the lithographic surface can be made impervious to chemical or solvent attack by postexposing the lithographic surface. Alternatively, the exposed areas of the photopolymerizable element, after the underexposed areas are transferred, can be used as a lithographic-offset printing plate if they are hydrophobic and the original sheet support is hydrophilic or vice versa. The element and process are also useful for making silk screens.

The advantages of this invention are due to the improved photopolymerizable element bearing a thin, thermally transferable wax cover stratum on the light-sensitive photopolymerizable layer of the element. The transferable cover stratum can be easily incorporated in the element during manufacture, resulting in no inconvenience to the user of the element. No additional steps are required by the user, e.g., removal of the cover stratum, during the thermal transfer process since the cover stratum is transferred with the underexposed image areas.

By using a cover stratum, the concentration of atmospheric oxygen in contact with the surface of the photopolymerizable stratum at the time of imagewise exposure is materially reduced. The photopolymerizable element therefore has an increased sensitivity or speed to the actinic radiation, exhibits increased contrast and also exhibits an increase in the degree of polymerization, resulting in an increase in the difference of stick temperatures between the exposed and underexposed areas. An additional advantage is that the tendency for "reciprocity law" failure, i.e., the dependence of stick temperature on radiation intensity at constant exposure, is reduced. A still further advantage is the low cost of the materials used for providing the cover stratum, particularly where the stratum is applied as an extremely thin layer, e.g., in the range of 0.00001 to 0.0005 inch in thickness.

As practical results of the above advantages, it is possible to eliminate the necessity of exposure in vacuum printing frames, to use simple and economical low intensity exposure sources, to make satisfactory reproductions of low contrast original images or to make copies by reflex exposure (which has the effect of reducing contrast), and to permit less stringent control of the temperature of the thermal development processes.

Still another advantage resulting from the reduced oxygen inhibition is the elimination of the surface effect whereby a thin surface layer tends to remain essentially unpolymerized after exposure. In the case of transfer of an image from such a layer to an image-receptive surface, this surface effect can cause a "stain" or a slight undesired transfer of material from the exposed areas.

Still further advantages will be apparent to those skilled in the art of image formation.

I claim:

1. An image-yielding element comprising a support bearing a photopolymerizable stratum solid below 40° C., said stratum being thermally transferable by having a stick temperature above 40° C. and below 220° C., comprising (a) a viscosity-modifying agent, and (b) a non-gaseous ethylenically unsaturated compound containing at least one terminal ethylenic group, having a boiling point above 100° C. at normal atmospheric pressure, being capable of forming a high polymer by free-radical initiated, chain-propagating, addition polymerization, said constituents (a) and (b) being present in amounts from 3 to 97 and 97 to 3 parts by weight, respectively, said photopolymerizable stratum bearing a cover stratum having a thickness of 0.00001 to 0.004 inch comprising at least one wax, the cover stratum being characterized by having a melting point of at least 40° C., having low permeability to oxygen and being capable of transmitting actinic radiation.

2. An element according to claim 1 wherein the cover stratum contains at least 15% by weight of said wax.

3. An element according to claim 1 wherein said cover stratum is composed essentially of wax.

4. An element according to claim 1 wherein said cover stratum is composed of an inner stratum of wax and an outer particulate stratum.

5. An element as defined in claim 1 wherein said cover stratum is essentially colorless.

6. An element as defined in claim 1 wherein said support is a macromolecular organic polymeric film.

7. An element as defined in claim 1 wherein said support is a polyester film.

8. An element as defined in claim 1 wherein said cover stratum comprises a mixture of paraffin wax and synthetic ozokerite wax.

9. An element as defined in claim 1 wherein said cover stratum comprises fully refined paraffin wax.

10. An element as defined in claim 1 wherein said cover stratum comprises a mixture of carnauba and paraffin waxes.

11. An element as defined in claim 1 wherein said cover stratum comprises a mixture of synthetic ozokerite wax and synthetic paraffin wax of the Fischer-Tropsch type.

12. An element as defined in claim 1 wherein said cover stratum contains dispersed therein a finely divided material which is infusible at 220° C.

13. An element as defined in claim 1 wherein said cover stratum contains dispersed thereon a finely divided material which is infusible at 220° C.

14. An element as defined in claim 1 wherein said photopolymerizable stratum contains (c) at least 0.001 part per hundred parts by weight of components (a) and (b) of a free-radical generating polymerization initiator activatable by actinic radiation, and (d) 0.001 to 4.0 parts per hundred parts by weight of constituents (a) and (b) of a thermal addition polymerization inhibitor.

15. An element as defined in claim 1 wherein said ethylenically unsaturated compound is a diacrylate of a diol of the formula $HO(CH_2CH_2O)_nH$ wherein n is an integer from 1 to 20.

16. An element as defined in claim 1 wherein said photopolymerizable stratum comprises (a) a pentaerythritol polyacrylate and triethylene glycol diacrylate, (b) cellulose acetate butyrate and cellulose acetate, and (c) phenanthrenequinone.

17. An image-yielding element comprising a support bearing a photopolymerizable stratum solid below 40° C., said stratum being thermally transferable by having a stick temperature above 40° C. and below 220° C., comprising a thermoplastic polymeric compound having pendent terminally unsaturated groups, said photopolymerizable stratum bearing a cover stratum having a thickness of 0.00001 to 0.004 inch comprising at least one wax, the cover stratum being characterized by having a melting point of at least 40° C., having low permeability to oxygen and being capable of transmitting actinic radiation.

18. A process for reproducing an image from a photopolymerizable element which comprises exposing with actinic radiation, imagewise, said photopolymerizable element comprising a support bearing a photopolymerizable stratum solid below 40° C., said stratum bearing a cover stratum having a thickness of 0.00001 to 0.004 inch comprising at least one wax, the cover stratum being characterized by having a melting point of at least 40° C., having low permeability to oxygen and being capable of transmitting said actinic radiation, until polymerization, with an accompanying increase in stick temperature, of the photopolymerizable stratum takes place in the exposed image areas with substantially less polymerization and less increase in stick temperature in the underexposed, complementary, adjoining, coplanar image areas to provide a difference of at least 10° C., in the stick temperature of said exposed areas, and subsequently transferring said image corresponding to the underexposed image areas and the overlaying wax stratum by bringing the surface of the exposed element into operative contact with the surface of an image-receptive support at an operating temperature intermediate between the stick temperatures of said exposed and underexposed image areas and at least equal to the melting point of said cover stratum and then separating the two surfaces at a temperature intermediate between the stick temperature of the exposed and underexposed image areas.

19. A process for reproducing an image from a photopolymerizable element which comprises exposing with actinic radiation, imagewise, said photopolymerizable element comprising a support bearing a photopolymerizable stratum solid below 40° C., said stratum being thermally transferable by having a stick temperature above 40° C. and below 220° C., comprising (a) a viscosity-modifying agent, (b) a non-gaseous ethylenically unsaturated compound containing at least one terminal ethylenic group, having a boiling point above 100° C. at normal atmospheric pressure, being capable of forming a high polymer by free-radical initiated, chain-propagating, addition polymerization, said constituents (a) and (b) being present in amounts from 3 to 97 and 97 to 3 parts by weight, respectively, said photopolymerizable stratum bearing a cover stratum having a thickness of 0.0001 to 0.004 inch comprising at least one wax, the cover stratum being characterized by having a melting point of at least 40° C., having low permeability to oxygen and being capable of transmitting said actinic radiation, until polymerization, with an accompanying increase in stick temperature, of the photopolymerizable stratum takes place in the exposed image areas with substantially less polymerization and less increase in stick temperature in the underexposed, complementary, adjoining, coplanar image areas to provide a difference of at least 10° C. in the stick temperature of said exposed and underexposed areas, and subsequently transferring said image corresponding to the underexposed image areas and the overlaying wax stratum by bringing the surface of the exposed element into operative contact with the surface of an image-receptive support at an operating temperature intermediate between the stick temperatures of said exposed and underexposed image areas and at least equal to the melting point of said cover stratum and then separating the two surfaces at a temperature intermediate between the stick temperature of the exposed and underexposed image areas.

20. A process as defined in claim 19 wherein said photopolymerizable stratum contains (c) at least 0.001 part per hundred parts by weight of components (a) and (b) of a free-radical generating polymerization initiator activatable by actinic radiation, and (d) 0.001 to 4.0 parts per hundred parts by weight of constituents (a) and (b) of a thermal addition polymerization inhibitor.

21. A process as defined in claim 19 wherein said image-receptive support is paper.

22. A process as defined in claim 19 wherein said imagewise exposure is through the support and photopolymerizable stratum and by means of reflected radiation from an image-bearing medium placed beyond said stratum.

References Cited by the Examiner

UNITED STATES PATENTS

| | | | |
|---|---|---|---|
| 1,992,965 | 3/35 | Rowell | 96—75 |
| 3,060,026 | 10/62 | Heiart | 96—28 |

NORMAN G. TORCHIN, *Primary Examiner.*